United States Patent
Li

(10) Patent No.: US 10,078,993 B2
(45) Date of Patent: Sep. 18, 2018

(54) GATE DRIVER ON ARRAY SUBSTRATE AND LIQUID CRYSTAL DISPLAY ADOPTING THE SAME

(71) Applicant: WUHAN CHINA STAR OPTOELECTRONICS TECHNOLOGY CO., LTD., Wuhan (CN)

(72) Inventor: Yafeng Li, Wuhan (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 373 days.

(21) Appl. No.: 14/905,024

(22) PCT Filed: Dec. 23, 2015

(86) PCT No.: PCT/CN2015/098399
§ 371 (c)(1),
(2) Date: Jan. 14, 2016

(87) PCT Pub. No.: WO2017/063269
PCT Pub. Date: Apr. 20, 2017

(65) Prior Publication Data
US 2017/0256221 A1   Sep. 7, 2017

(30) Foreign Application Priority Data

Oct. 15, 2015   (CN) .......................... 2015 1 0666807

(51) Int. Cl.
G09G 3/36     (2006.01)
G11C 19/18    (2006.01)
G11C 19/28    (2006.01)

(52) U.S. Cl.
CPC ......... G09G 3/3677 (2013.01); G11C 19/184 (2013.01); G11C 19/28 (2013.01);
(Continued)

(58) Field of Classification Search
CPC ......... G09G 3/3677; G09G 2300/0809; G09G 2310/0286; G11C 19/184
See application file for complete search history.

(56) References Cited

U.S. PATENT DOCUMENTS

2008/0042965 A1* 2/2008 Cheng ................. G09G 3/3677
                                                    345/100
2008/0246739 A1   10/2008 Choi et al.
(Continued)

FOREIGN PATENT DOCUMENTS

CN   101281725 A   10/2008
CN   201918042 U    8/2011
(Continued)

*Primary Examiner* — Kumar Patel
*Assistant Examiner* — Amy C Onyekaba
(74) *Attorney, Agent, or Firm* — Osha Liang LLP

(57) ABSTRACT

A GOA substrate includes N shift register units. The first stage shift register unit outputs a scan signal pulse based on a first clock signal and a start signal. The last stage shift register unit outputs a scan signal pulse based on Mth clock signal and the start signal. The start signal has a pulse width starting from a falling edge of the Mth clock signal of the last stage shift register unit when scanning a first frame, and ending at a rising edge of the first clock signal of the first stage shift register unit when scanning a second frame. Since the first and last shift register units are used to drive a scan signal pulse based on the start signal, the present invention reduces the number of wires needed to transmit start signals and simplifies the complexity of the layout design.

12 Claims, 3 Drawing Sheets

(52) U.S. Cl.
CPC ............. *G09G 2300/0426* (2013.01); *G09G 2300/0809* (2013.01); *G09G 2310/0286* (2013.01)

(56) References Cited

U.S. PATENT DOCUMENTS

| | | |
|---|---|---|
| 2009/0027581 A1 | 1/2009 | You et al. |
| 2013/0335665 A1* | 12/2013 | Tseng ................. G02F 1/13306 349/43 |
| 2014/0159999 A1* | 6/2014 | Gu ........................ G11C 19/28 345/100 |
| 2014/0232964 A1* | 8/2014 | Tseng ................. H03K 17/161 349/42 |
| 2014/0340126 A1* | 11/2014 | Chang ................. G09G 3/3677 327/109 |
| 2015/0187302 A1 | 7/2015 | Dai |
| 2015/0310819 A1* | 10/2015 | Xiao ...................... G11C 19/28 345/212 |

FOREIGN PATENT DOCUMENTS

| | | |
|---|---|---|
| CN | 103745700 A | 4/2014 |
| CN | 103928009 A | 7/2014 |
| CN | 104332127 A | 2/2015 |
| CN | 204189456 U | 3/2015 |
| CN | 104658498 A | 5/2015 |
| KR | 20090010764 A | 1/2009 |
| KR | 20130101760 A | 9/2013 |

\* cited by examiner

GATE DRIVER ON ARRAY SUBSTRATE AND LIQUID CRYSTAL DISPLAY ADOPTING THE SAME

BACKGROUND OF THE INVENTION

1. Field of the Invention

The present invention relates to liquid crystal display (LCD), and more specifically, to a LCD adopting gate driver on array (GOA) substrate.

2. Description of the Prior Art

A gate driver is disposed on a glass substrate comprising a thin film transistor (TFT) in the process of a thin film transistor liquid crystal display (TFT-LCD) array for performing row-by-row scanning.

A GOA circuit comprises a plurality of shift register units, each composed of a pull-up circuit, a pull-up control circuit, a pull-down circuit, a pull-down holding circuit and a boost circuit responsible for boosting the electric potential.

The pull-up circuit mainly outputs an inputted clock signal to a gate of the TFT as a drive signal for the LCD. The pull-up control circuit controls the switching of the pull-up circuit, mostly triggered by a signal transmitted from a previous stage GOA circuit. The pull-down circuit rapidly pulls the electric potential of a scan signal (i.e. the electric potential of the TFT's gate) to a low level after outputting the scan signal. The pull-down holding circuit, two operating alternately in most cases, holds the scan signal and a pull-up circuit signal (i.e. signals imposed on node Q) in an off status (i.e. a designated negative potential). The boost circuit is for two boosts of node Q's electric potential to ensure a normal output of G(n) of the pull-up circuit.

Generally speaking, the voltage of node Q of the shift register unit at the current stage is pulled up by the output voltage of the shift register unit at a previous stage, and is pulled down by the output voltage of the shift register unit at a next stage. Therefore, the GOA circuit needs at least two start signals STV1 and STV2. The start signal STV1 serves as a pull-up signal of node Q for the shift register unit at a first stage. The start signal STV2 serves as a pull-down signal of node Q for the shift register unit at a last stage. However, applying two start signals means more wires are needed to transmit signals, which increases the complexity in design.

SUMMARY OF THE INVENTION

An object of the present invention is to provide a GOA substrate and a LCD adopting the GOA substrate, so to solve the existing technical problem.

According to the present invention, a gate driver on array (GOA) substrate comprises a plurality of pixel units arranged in an array, a plurality of transistors, each electrically connected to one of the pixel units, and N shift register units connected in cascade. Each M shift register units are controlled by M clock signals. A first stage shift register unit outputs a scan signal pulse from an output terminal based on a first clock signal and a start signal. A last stage shift register unit outputs a scan signal pulse from the output terminal based on a Mth clock signal and the start signal. N and M are positive integers, and N is larger than M. The start signal has a frequency equal to a frame rate to display a frame. The M clock signals output signal pulses alternately, and the outputting time is not overlapped. The start signal has a pulse width starting from a falling edge of the Mth clock signal of the last stage shift register unit when scanning a first frame, and ending at a rising edge of the first clock signal of the first stage shift register unit when scanning a second frame. The second frame is the frame following the first frame.

Furthermore, each shift register unit comprises: a pull-up circuit, comprising a first transistor, with a gate coupled to a first node, a source coupled to the clock signals, a drain coupled to the output terminal, so to output the scan signal pulse from the output terminal based on the clock signals; a pull-up control circuit, comprising a second transistor, with a gate coupled to an output terminal of a previous stage shift register unit of each shift register unit, a source coupled to a first supply voltage, and a drain coupled to the first node, so to turn on the pull-up circuit based on the scan signal pulse of the previous shift register unit of each shift register unit; a boost circuit, coupled between the first node and the output terminal, for boosting the electric potential of the first node; a pull-down holding circuit, coupled to the first node, the clock signal and a second supply voltage, for holding the first node at a low level; and a pull-down circuit, coupled to the second supply voltage, the output terminal and the output terminal of the next shift register unit of each shift register unit, for pulling down the electric potential of the first node to the second supply voltage.

Furthermore, the pull-down circuit comprises: a third transistor, comprising a drain electrically connected to the output terminal, a source electrically connected to the second supply voltage; and a fourth transistor, comprising a drain electrically connected to the first node, a source electrically connected to the second supply voltage, and a gate electrically connected to the gate of the third transistor.

According to the present invention, a gate driver on array (GOA) substrate comprises a plurality of pixel units arranged in an array, a plurality of transistors, each electrically connected to one of the pixel units, and N shift register units connected in cascade. Each M shift register units are controlled by M clock signals. The first stage shift register unit outputs a scan signal pulse from the output terminal based on a first clock signal and a start signal. The last stage shift register unit outputs a scan signal pulse from an output terminal based on a Mth clock signal and the start signal. N and M are positive integers, and N is larger than M. The start signal has a pulse width starting from a falling edge of the Mth clock signal of the last stage shift register unit when scanning a first frame, and ending at a rising edge of the first clock signal of the first stage shift register unit when scanning a second frame. The second frame is the frame following the first frame.

Furthermore, the start signal has a frequency equal to a frame rate.

Furthermore, the M clock signals output signal pulses alternately, and the outputting time is not overlapped.

Furthermore, each shift register unit comprises: a pull-up circuit, comprising a first transistor, with a gate coupled to a first node, a source coupled to the clock signals, a drain coupled to the output terminal, so to output scan signal pulse from the output terminal based on the clock signals; a pull-up control circuit, comprising a second transistor, with a gate coupled to the output terminal of a previous shift register unit of each shift register unit, a source coupled to a first supply voltage, and a drain coupled to the first node, so to turn on the pull-up circuit based on the scan signal pulse of the previous shift register unit of each shift register unit; a pull-down holding circuit, coupled to the first node, the clock signal and a second supply voltage, for holding the first node at a low level; and a pull-down circuit, coupled to the second supply voltage, the output terminal and the output terminal of the next shift register unit of each shift register unit, for pulling down the electric potential of the first node to the second supply voltage.

Furthermore, the shift register unit further comprises a boost circuit, coupled to the first node and the output terminal, to boost the electric potential of the first node.

Furthermore, the pull-down circuit comprises: a third transistor, comprising a drain electrically connected to the output terminal, a source electrically connected to the second supply voltage; and a fourth transistor, comprising a drain electrically connected to the first node, a source electrically connected to the second supply voltage, and a gate electrically connected to the gate of the third transistor.

According to the present invention, a liquid crystal display comprises a source driver for outputting data signal to a plurality of pixel units to show images, and a gate driver on array (GOA) substrate for outputting scan signal to turn on a plurality of transistors. The GOA substrate comprises N shift register units connected in cascade. Each M shift register units controlled by M clock signals; the first stage shift register unit outputs a scan signal pulse from the output terminal based on a first clock signal and a start signal; the last stage shift register unit outputs a scan signal pulse from an output terminal based on a Mth clock signal and the start signal. N and M are positive integers, and N is larger than M. The start signal has a pulse width starting from a falling edge of the Mth clock signal of the last stage shift register unit when scanning a first frame, and ending at a rising edge of the first clock signal of the first stage shift register unit when scanning a second frame; the second frame is the frame following the first frame.

Furthermore, the start signal has a frequency equal to a frame rate.

Furthermore, the M clock signals output signal pulses alternately, and the outputting time is not overlapped.

Furthermore, each shift register unit comprises: a pull-up circuit, comprising a first transistor, with a gate coupled to a first node, a source coupled to the clock signals, a drain coupled to the output terminal, so to output scan signal pulse from the output terminal based on the clock signals; a pull-up control circuit, comprising a second transistor, with a gate coupled to the output terminal of a previous shift register unit of each shift register unit, a source coupled to a first supply voltage, and a drain coupled to the first node, so to turn on the pull-up circuit based on the scan signal pulse of the previous shift register unit of each shift register unit; a pull-down holding circuit, coupled to the first node, the clock signal and a second supply voltage, for holding the first node at a low level; and a pull-down circuit, coupled to the second supply voltage, the output terminal and the output terminal of the next shift register unit of each shift register unit, for pulling down the electric potential of the first node to the second supply voltage.

Furthermore, the shift register unit further comprises a boost circuit, coupled to the first node and the output terminal, to boost the electric potential of the first node.

Furthermore, the pull-down circuit comprises: a third transistor, comprising a drain electrically connected to the output terminal, a source electrically connected to the second supply voltage; and a fourth transistor, comprising a drain electrically connected to the first node, a source electrically connected to the second supply voltage, and a gate electrically connected to the gate of the third transistor.

In contrast to prior art, the first and last shift register units of the GOA substrate of the present invention are used to drive and output a scan signal pulse based on a start signal. Therefore, the present invention reduces the number of wires needed to transmit start signals and simplifies the complexity of the layout design.

These and other features, aspects and advantages of the present disclosure will become understood with reference to the following description, appended claims and accompanying figures.

DETAILED DESCRIPTION OF PREFERRED EMBODIMENTS

Figure 1:
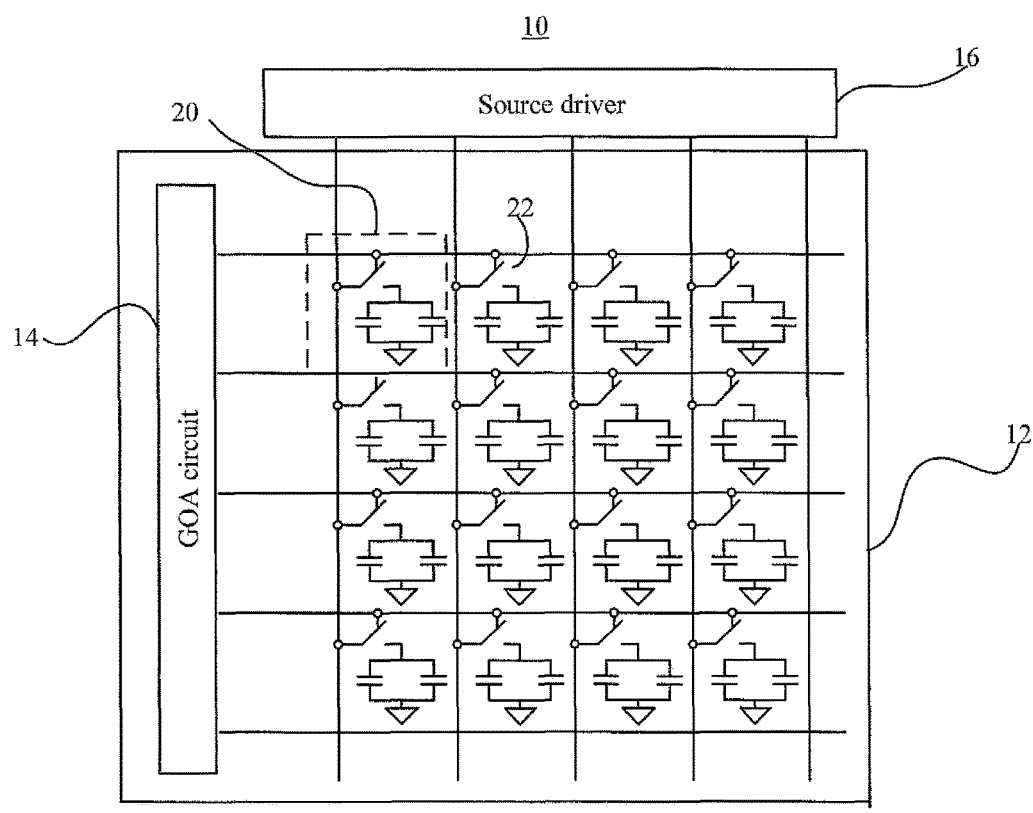
FIG. 1 is a functional block diagram of a LCD of the present invention.

Please refer to FIG. 1. FIG. 1 is a functional block diagram of a LCD 10 of the present invention. The LCD 10 comprises a GOA substrate 12, a GOA circuit 14 and a source driver 16. The GOA substrate 12 comprises a plurality of pixels arranged in an array, and each pixel is composed of three pixel units 20, representing the three primary colors—red, green and blue (RGB). For example, a LCD 10 with 1024×768 resolution needs a total of 1024×768×3 pixel units 20. The GOA circuit 14 outputs a scan signal so that transistors 22 in each row are turned on one after another, while the source driver 16 outputs a corresponding data signal to a whole row of pixel units 20 so that each unit is charged to its required voltage respectively to display different gray scales. When one row completes charging, the GOA circuit 14 turns off the scan signal. Then, the GOA circuit 14 outputs a scan signal again to turn on transistors 22 in the next row, and the source driver 16 charges/discharges pixel units 20 in the next row. This process is repeated until all the pixel units 20 of the GOA substrate 12 are charged, and then it starts from the first row again.

In the design of the current LCD panel, the GOA circuit 14 outputs scan signals based on a fixed interval. Take a LCD 10 with 1024×768 resolution and 60 Hz frame rate as an example: the display time for each frame is about $1/60=16.67$ ms, so the pulse of each scan signal is $16.67$ ms/$768=21.7$ µs. Within the 21.7 µs, the source driver 16 charges/discharges the pixel units 20 to the required voltages to display the corresponding gray scales.

Figure 2:
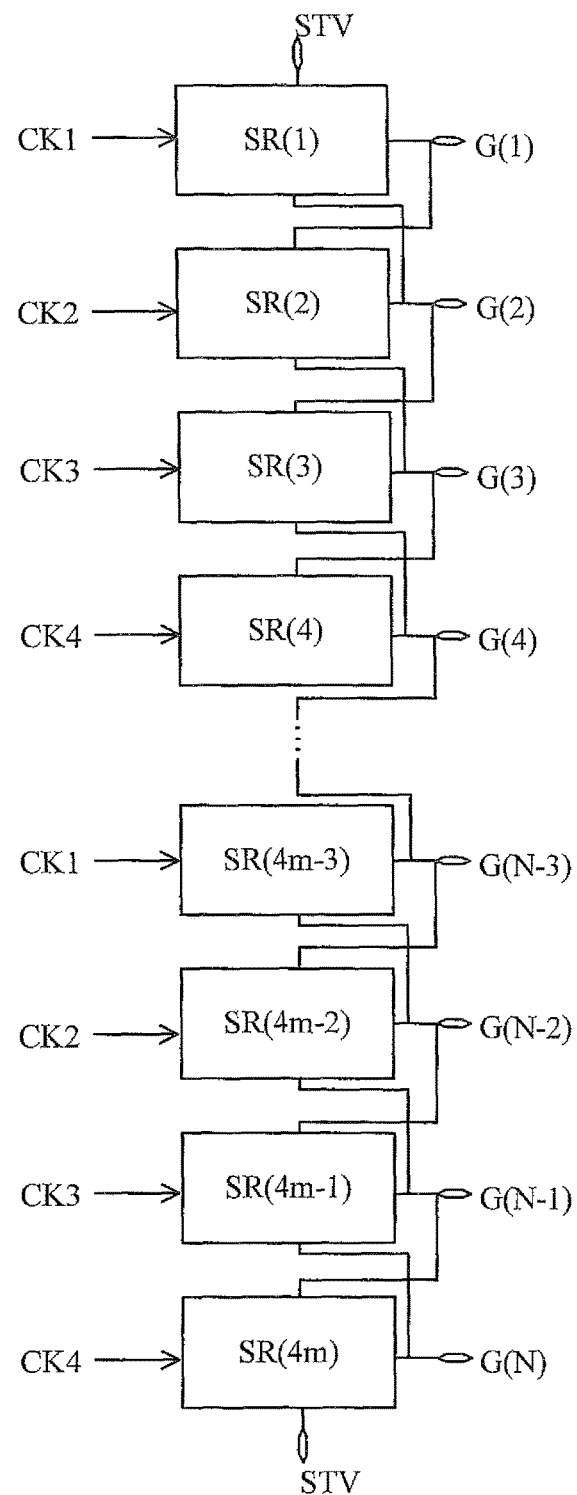
FIG. 2 is a block diagram of a shift register unit of the GOA circuit of the present invention.

Please refer to FIG. 2. FIG. 2 is a block diagram of a shift register unit SR(n) of the GOA circuit 14 of the present invention. The GOA circuit 14 comprises N cascade-connected shift register units SR(n), each M of them is controlled by M clock signals. n, N and M are positive integers; n is smaller than or equal to N, while N is larger than M. For example, with a LCD 10 with 1024×768 resolution, N is 768 and M can be 4. In the present embodiment, each of the four shift register units SR(4 $m$-3), SR(4 $m$-2), SR(4 $m$-1) and SR(4 $m$) is controlled by clock signals CK1, CK2, CK3 and CK4 respectively. The m is 0 or a positive integer, and smaller or equal to M/4. Pulse signals of the four clock signals CK1 to CK4 are generated alternately without overlap. The shift register unit SR(n) outputs a scan signal from an output terminal G(n) based on a clock signal and a scan signal outputted from an output terminal G(n−1) of a previous stage shift register unit SR(n−1). When a first stage shift register unit SR(1) receives a start pulse STY, it outputs a scan signal pulse from an output terminal G(1) based on a clock signal CK1. Then, when a second stage shift register unit SR(2) receives the scan signal pulse outputted from the output terminal G(1) of the previous stage shift register SR(1), it outputs a scan signal pulse from an output terminal G(2) based on a clock signal CK2. The process continues as such that each shift register unit SR(n), when receiving the scan signal pulse outputted from the output terminal G(n−1) of a previous stage shift register unit SR(n−1), outputs its scan signal pulse from the output terminal G(n) based on its corresponding clock signal, one of the four signals, CK1 to CK4. The scan signal pulse turns on transistors of a corresponding pixel unit 20.

Figure 3:
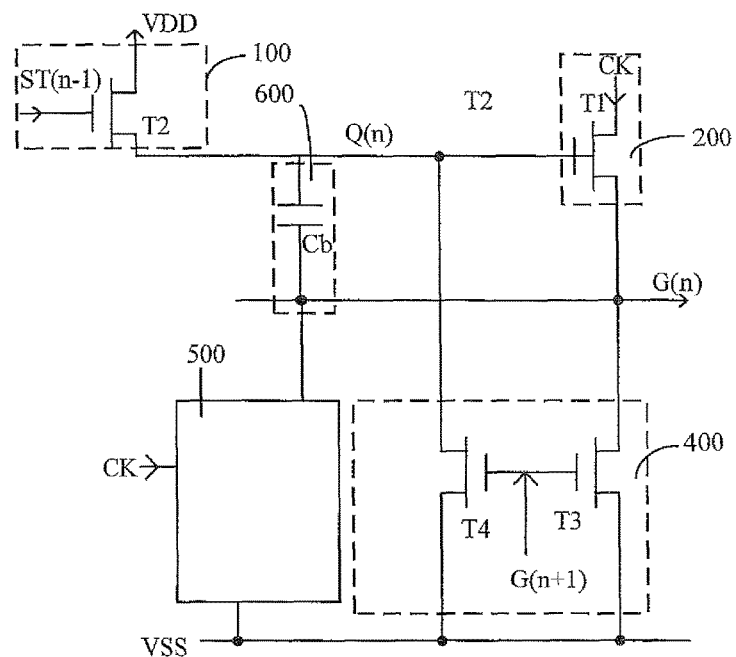
FIG. 3 is a circuit diagram of the shift register units of the preferred embodiment in FIG. 2.

Please refer to FIG. 3. FIG. 3 is a circuit diagram of the shift register units of the preferred embodiment in FIG. 2. Each shift register unit SR(n) comprises a pull-up control circuit 100, a pull-up circuit 200, a pull-down circuit 400, a pull-down holding circuit 500 and a boost circuit 600. Given that every shift register unit has the same structure, to simplify the explanation, a clock signal CK is used to represent one of the four clock signals, CK1 to CK4, in the present embodiment. The pull-up circuit 200 can be a first transistor T1, comprising a gate coupled to a first node Q(n), a source coupled to the clock signal CK, and a drain coupled to the output terminal G(n). The pull-up circuit 200 provides a scan signal pulse from the output terminal G(n) based on the clock signal CK. The pull-up control circuit 100 can be a second transistor T2, comprising a gate coupled to a first supply voltage VDD, a source coupled to the output terminal G(n−1) of the previous shift register unit SR(n−1), and a drain coupled to the first node Q(n). The pull-up control circuit 100 turns on the pull-up circuit 200 based on the scan signal pulse of the previous shift register unit SR(n−1). The boost circuit 600 can be a capacitor Cb, coupled to a node between the first node and the output terminal G(n), to boost the electric potential of the first node Q(n). The pull-down holding circuit 500 is coupled to the first node G(n), clock signal CK and a second supply voltage VSS, so to hold the first node Q(n) at a low level. The pull-down circuit 400 is coupled to the second supply voltage VSS, the output terminal G(n) and an output terminal G(n+1) of a next shift register unit SR(n+1) of each shift register unit, so to pull down the electric potential of the first node Q(n) to the second supply voltage VSS.

The pull-down circuit 400 comprises a third transistor T3 and fourth transistor T4. The third transistor T3 comprises a gate coupled to the output terminal G(n+1) of the next shift register unit SR(n+1) of each shift register unit, a source coupled to the output terminal G(n), and a drain coupled to the second supply voltage VSS. The fourth transistor T4 comprises a gate coupled to the output terminal G(n+1) of the next shift register unit SR(n+1) of each shift register unit, a source coupled to a first node Q(n), and a drain coupled to the second supply voltage VSS. In the present embodiment, the gates of the third transistor T3 and fourth transistor T4 of the pull-down circuit 400 of the last stage shift register SR(n) electrically connect the start pulse STV.

Figure 4:
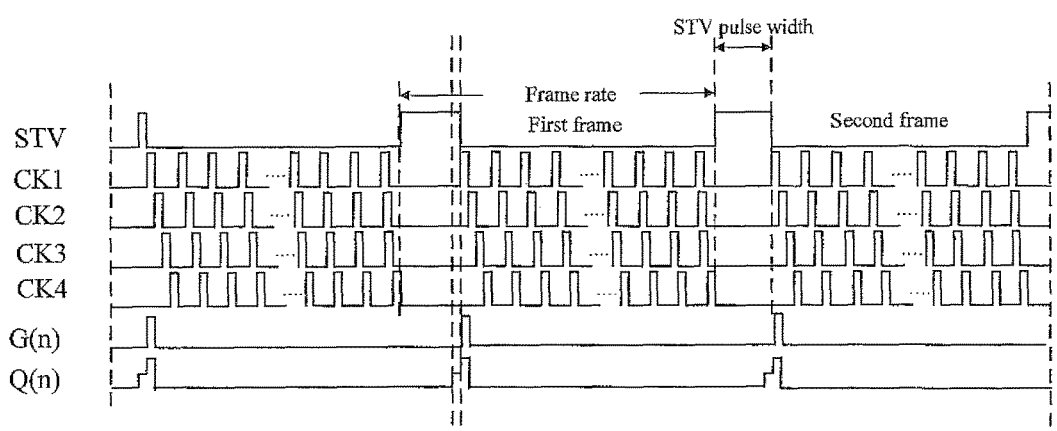
FIG. 4 is a timing chart of various input signals, output signals and node voltages shown in FIG. 3.

Please refer to FIG. 2, FIG. 3 and FIG. 4. FIG. 4 is a timing chart of various input signals, output signals and node voltages shown in FIG. 3. The frequency of the start pulse STV equals to a frame rate. For example, the GOA substrate 12 with 1024×768 resolution and 60 Hz frame rate would have a start pulse STV at 1/60=16.67 ms. Preferably, the pulse width of the start signal STY begins from a falling edge of the clock signal CK4 of a last stage shift register unit SR(N) when scanning a first frame, and ends at a rising edge of the first clock signal CK1 of a first shift register unit SR(1) when scanning a second frame. The second frame is the frame following the first frame. Given that the clock signal CK4 corresponding to the last stage shift register SR(N) is in a blank status, i.e. at a low level, the start signal STV, at a high level at the moment, does not at all affect the last stage shift register unit SR(N). When all clock signals CK1 to CK4 enter into the blank status again, the start signal STV is turned on again and pulls down the voltage of node Q of the last stage shift register SR(N). The high level of the start signal STV continues until the second frame, serving as a signal to pull up the voltage of node Q of the first stage shift register unit SR(1) when scanning the second frame. Thus, the start signal STV can be a signal to pull up the voltage of node Q of the shift register SR(1), or pull down the voltage of node Q of the last stage shift register SR(N). Therefore, the design reduces the number of start signals.

The first and last shift register units of the GOA substrate of the present invention are used to drive and output a scan signal pulse based on a start signal. Comparing with conventional technology, the present invention reduces the number of wires needed to transmit start signals and simplifies the complexity of the layout design.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A gate driver on array (GOA) substrate, comprising:
   a plurality of pixel units arranged in an array;
   a plurality of transistors, each electrically connected to one of the pixel units; and
   N shift register units, connected in cascade, with each M shift register units controlled by M clock signals; a first stage shift register unit outputs a scan signal pulse from an output terminal based on a first clock signal and a start signal; a last stage shift register unit outputs a scan signal pulse from the output terminal based on a Mth clock signal and the start signal, where N and M are positive integers, and N is larger than M;
   wherein the start signal has a frequency equal to a frame rate to display a frame;
   the M clock signals output signal pulses alternately, and the outputting time is not overlapped;
   the start signal has a pulse width starting from a falling edge of the Mth clock signal of the last stage shift register unit when scanning a first frame, and ending at a rising edge of the first clock signal of the first stage shift register unit when scanning a second frame; the second frame is the frame following the first frame,
   wherein each shift register unit comprises:
   a pull-up circuit, comprising a first transistor, with a gate coupled to a first node, a source coupled to the clock signals, a drain coupled to the output terminal, so to output the scan signal pulse from the output terminal based on the clock signals;
   a pull-up control circuit, comprising a second transistor, with a gate coupled to an output terminal of a previous stage shift register unit of each shift register unit, a source coupled to a first supply voltage, and a drain coupled to the first node, so to turn on the pull-up circuit based on the scan signal pulse of the previous shift register unit of each shift register unit;

a boost circuit, coupled between the first node and the output terminal, for boosting the electric potential of the first node;

a pull-down holding circuit, coupled to the first node, the clock signal and a second supply voltage, for holding the first node at a low level; and a pull-down circuit, coupled to the second supply voltage, the output terminal and the output terminal of the next shift register unit of each shift register unit, for pulling down the electric potential of the first node to the second supply voltage.

2. The GOA substrate of claim 1, wherein the pull-down circuit comprises:

a third transistor, comprising a drain electrically connected to the output terminal, a source electrically connected to the second supply voltage; and a fourth transistor, comprising a drain electrically connected to the first node, a source electrically connected to the second supply voltage, and a gate electrically connected to the gate of the third transistor.

3. A gate driver on array (GOA) substrate, comprising:

a plurality of pixel units arranged in an array;

a plurality of transistors, each electrically connected to one of the pixel units; and N shift register units, connected in cascade, with each M shift register units controlled by M clock signals; the first stage shift register unit outputs a scan signal pulse from the output terminal based on a first clock signal and a start signal; the last stage shift register unit outputs a scan signal pulse from an output terminal based on a Mth clock signal and the start signal, where N and M are positive integers, and N is larger than M;

wherein the start signal has a pulse width starting from a falling edge of the Mth clock signal of the last stage shift register unit when scanning a first frame, and ending at a rising edge of the first clock signal of the first stage shift register unit when scanning a second frame; the second frame is the frame following the first frame, wherein each shift register unit comprises:

a pull-up circuit, comprising a first transistor, with a gate coupled to a first node, a source coupled to the clock signals, a drain coupled to the output terminal, so to output scan signal pulse from the output terminal based on the clock signals;

a pull-up control circuit, comprising a second transistor, with a gate coupled to the output terminal of a previous shift register unit of each shift register unit, a source coupled to a first supply voltage, and a drain coupled to the first node, so to turn on the pull-up circuit based on the scan signal pulse of the previous shift register unit of each shift register unit;

a pull-down holding circuit, coupled to the first node, the clock signal and a second supply voltage, for holding the first node at a low level; and a pull-down circuit, coupled to the second supply voltage, the output terminal and the output terminal of the next shift register unit of each shift register unit, for pulling down the electric potential of the first node to the second supply voltage.

4. The GOA substrate of claim 3, wherein the start signal has a frequency equal to a frame rate.

5. The GOA substrate of claim 3, wherein the M clock signals output signal pulses alternately, and the outputting time is not overlapped.

6. The GOA substrate of claim 3, wherein the shift register unit further comprises a boost circuit, coupled to the first node and the output terminal, to boost the electric potential of the first node.

7. The GOA substrate of claim 6, wherein the pull-down circuit comprises:

a third transistor, comprising a drain electrically connected to the output terminal, a source electrically connected to the second supply voltage; and a fourth transistor, comprising a drain electrically connected to the first node, a source electrically connected to the second supply voltage, and a gate electrically connected to the gate of the third transistor.

8. A liquid crystal display, comprising:

a source driver, for outputting data signal to a plurality of pixel units to show images; and a gate driver on array (GOA) substrate, for outputting scan signals to turn on a plurality of transistors, the GOA substrate comprising:

N shift register units, connected in cascade, with each M shift register units controlled by M clock signals; the first stage shift register unit outputs a scan signal pulse from the output terminal based on a first clock signal and a start signal; the last stage shift register unit outputs a scan signal pulse from an output terminal based on a Mth clock signal and the start signal, where N and M are positive integers, and N is larger than M;

wherein the start signal has a pulse width starting from a falling edge of the Mth clock signal of the last stage shift register unit when scanning a first frame, and ending at a rising edge of the first clock signal of the first stage shift register unit when scanning a second frame; the second frame is the frame following the first frame, wherein each shift register unit comprises:

a pull-up circuit, comprising a first transistor, with a gate coupled to a first node, a source coupled to the clock signals., a drain coupled to the output terminal, so to output scan signal pulse from the output terminal based on the clock signals;

a pull-up control circuit, comprising a second transistor, with a gate coupled to the output terminal of a previous shift register unit of each shift register unit, a source coupled to a first supply voltage, and a drain coupled to the first node, so to turn on the pull-up circuit based on the scan signal pulse of the previous shift register unit of each shift register unit;

a pull-down holding circuit, coupled to the first node, the clock signal and a second supply voltage, for holding the first node at a low level; and a pull-down circuit, coupled to the second supply voltage, the output terminal and the output terminal of the next shift register unit of each shift register unit, for pulling down the electric potential of the first node to the second supply voltage.

9. The liquid crystal display of claim 8, wherein the start signal has a frequency equal to a frame rate.

10. The liquid crystal display of claim 8, wherein the M clock signals output signal pulses alternately, and the outputting time is not overlapped.

11. The liquid crystal display of claim 8, wherein the shift register unit further comprises a boost circuit, coupled to the first node and the output terminal, to boost the electric potential of the first node.

12. The liquid crystal display of claim 11, wherein the pull-down circuit comprises:

a third transistor, comprising a drain electrically connected to the output terminal, a source electrically connected to the second supply voltage; and
a fourth transistor, comprising a drain electrically connected to the first node, a source electrically connected to the second supply voltage, and a gate electrically connected to the gate of the third transistor.

\* \* \* \* \*